United States Patent
Briggs et al.

(10) Patent No.: US 7,081,780 B2
(45) Date of Patent: Jul. 25, 2006

(54) RESET CIRCUITRY FOR AN INTEGRATED CIRCUIT

(76) Inventors: Randall Don Briggs, 11263 W. Hickory Dale Dr., Boise, ID (US) 83713; Douglas Gene Keithley, 10740 W. Skycrest St., Boise, ID (US) 83713; William Randolph Schmidt, 12250 W. Silverking St., Boise, ID (US) 83709

( * ) Notice: Subject to any disclaimer, the term of this patent is extended or adjusted under 35 U.S.C. 154(b) by 89 days.

(21) Appl. No.: 10/858,771

(22) Filed: Jun. 1, 2004

(65) Prior Publication Data

US 2005/0264328 A1 Dec. 1, 2005

(51) Int. Cl.
*H03K 17/22* (2006.01)
(52) U.S. Cl. .................... 327/143; 327/198
(58) Field of Classification Search .......... 327/142, 327/143, 198
See application file for complete search history.

(56) References Cited

U.S. PATENT DOCUMENTS

| | | | |
|---|---|---|---|
| 4,968,899 A * | 11/1990 | Katsutani et al. ............. 327/99 |
| 5,045,811 A | 9/1991 | Lewis | |
| 5,739,708 A * | 4/1998 | LeWalter .................... 327/143 |
| 5,801,561 A * | 9/1998 | Wong et al. ................ 327/143 |
| 5,889,709 A * | 3/1999 | Fukuda .................. 365/189.05 |
| 5,933,036 A * | 8/1999 | Kim ........................... 327/143 |
| 6,417,704 B1 * | 7/2002 | Nakajima et al. ........... 327/143 |
| 6,429,732 B1 | 8/2002 | Tedrow et al. | |
| 6,556,057 B1 * | 4/2003 | McClure .................... 327/143 |
| 6,747,493 B1 * | 6/2004 | Ishikawa .................... 327/143 |
| 6,762,632 B1 * | 7/2004 | Himpe et al. .............. 327/142 |
| 2002/0145454 A1 * | 10/2002 | Jensen ....................... 327/142 |

* cited by examiner

*Primary Examiner*—Terry D. Cunningham

(57) ABSTRACT

Reset circuitry for an integrated circuit is presented. An internal oscillator produces an oscillating signal upon power-up of the integrated circuit. The internal oscillator is not dependent on signals generated outside the integrated circuit. An electro-static discharge blocker circuit receives an external reset signal generated outside the integrated circuit. The electrostatic discharge blocker circuit utilizes the oscillating signal to perform electro-static discharge blocking for the external reset signal to produce an internal reset signal.

17 Claims, 2 Drawing Sheets

US 7,081,780 B2

RESET CIRCUITRY FOR AN INTEGRATED CIRCUIT

BACKGROUND

An integrated circuit, such as an application specific integrated circuit (ASIC) may include bidirectional input/output (I/O) ports that are used to both send and receive data over the same set of wires. One difficulty in implementing such bidirectional I/O ports is to ensure two separate integrated circuits do not both simultaneously try to send data over the same set of wires at circuit power-up. This can happen, for example with an IEEE 1284 connection between devices, for example, a host and a printer. Concurrent driving of the same wires by two different integrated circuits can degrade reliability of the integrated circuits, increase radio frequency interference (RFI) and/or destroy ports connected to the wires.

Therefore, at power-up, each integrated circuit is responsible to inhibit driving data over bidirectional I/O ports. ASICs in prior art solutions have utilized a reset signal to disable driving data over I/O ports during power-up. The reset signal is generated from the printed circuit board (PCB) on which the ASIC resides. The circuitry within the ASIC that processes the reset signal typically performs a synchronization before forwarding the reset signal to I/O ports. Such synchronization utilizes a system clock originating outside the ASIC. However, the system clock can be tardy in becoming functional during power-up. Until the system clock is functional, synchronization circuitry is unable to pass the reset signal to the I/O ports and the result can be a "drive fight" where two integrated circuits attempt to simultaneously drive values on the same wires. The drive fight will persist until the system clock is functional and a reset signal reaches a bidirectional I/O port for one of the integrated circuits.

One way to speed up the arrival of the reset signal at a bidirectional I/O port is to provide an asynchronous path for the reset signal to the I/O port. This is done, for example, by using the reset signal to clear the flip-flops of the synchronization circuitry in order to allow the reset signal to reach the I/O ports without the necessity of waiting for the system clock to be functional and to make the synchronization circuitry operational. The synchronization circuitry performs synchronization only when the reset is de-asserted. However, this solution can result in inadequate protection against electro-static discharge (ESD). If during normal operations, a reset input is subject to ESD, this can result in a spurious signal erroneously clearing the flip-flops of the synchronization circuitry and a resulting spurious reset signal performing a reset on part or all of the integrated circuit.

SUMMARY OF THE INVENTION

In accordance with embodiments of the present invention, reset circuitry for an integrated circuit is presented. An internal oscillator produces an oscillating signal upon power-up of the integrated circuit. The internal oscillator is not dependent on signals generated outside the integrated circuit. An electro-static discharge blocker circuit receives an external reset signal generated outside the integrated circuit. The electro-static discharge blocker circuit utilizes the oscillating signal to perform electro-static discharge blocking for the external reset signal to produce an internal reset signal.

DESCRIPTION OF THE EMBODIMENT

Figure 1:
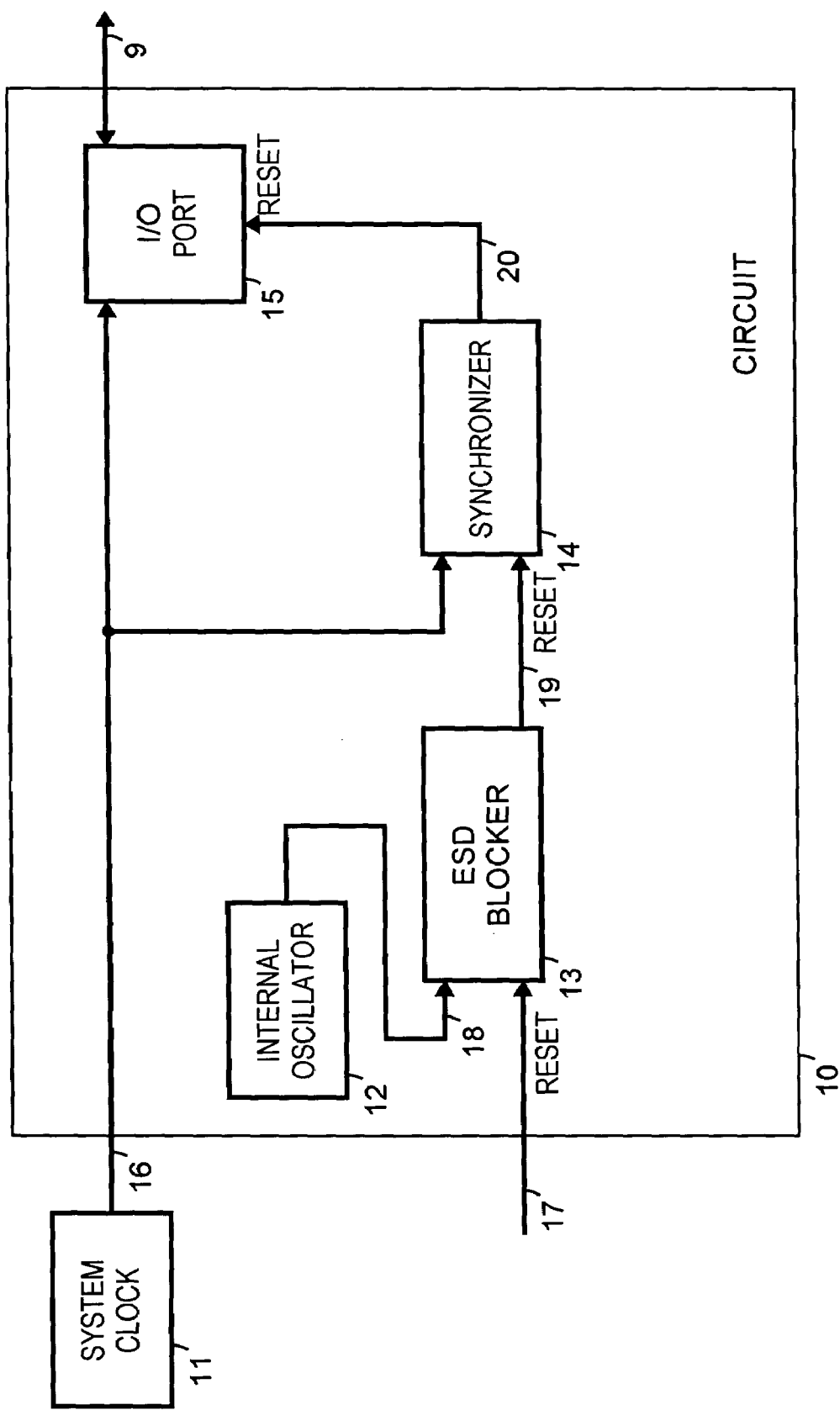
FIG. 1 is a simplified block diagram of power-on reset circuitry in accordance with an embodiment of the present invention.

FIG. 1 is a simplified block diagram of reset circuitry within a circuit 10. For example, circuit 10 is an application specific integrated circuit (ASIC) or some other type of circuit that utilizes input/output (I/O) ports.

The reset circuitry within circuit 10 includes an internal oscillator 12, an ESD blocker 13 and a synchronizer 14. Internal oscillator 12 provides an internally generated oscillating signal 18 to ESD blocker 13. Internal oscillator 12 immediately begins generating oscillating signal 18 when circuit 10 is powered up. Internal oscillator 12 does not rely upon an external clock or any other type of external signal to begin functioning.

ESD blocker 13 uses internally generated oscillating signal 18 as a clock signal to allow propagation of an externally generated reset signal 17 of sufficient width through to function as a synchronizer reset signal 19. ESD blocker 13 provides ESD protection for externally generated reset signal 17 without the requirement of a functioning external clock or other external oscillator.

Upon assertion of synchronizer reset signal 19, synchronizer 14 asynchronously forwards circuit reset signal 20 to circuit elements within circuit 10. The circuit elements within circuit 10 receiving reset signal 20 are represented by an I/O port 15, used to send and receive data across an I/O line 9. For example I/O port 15 is a bi-directional, tri-stateable I/O port.

An external system clock 11 generates a system clock 16 used to clock synchronizer 14, I/O port 15 and other circuit elements (not shown) within circuit 10. When externally generated reset signal 17 is de-asserted, synchronizer 14 utilizes system clock 16 to perform synchronization before de-asserting reset signal 20.

Figure 2:
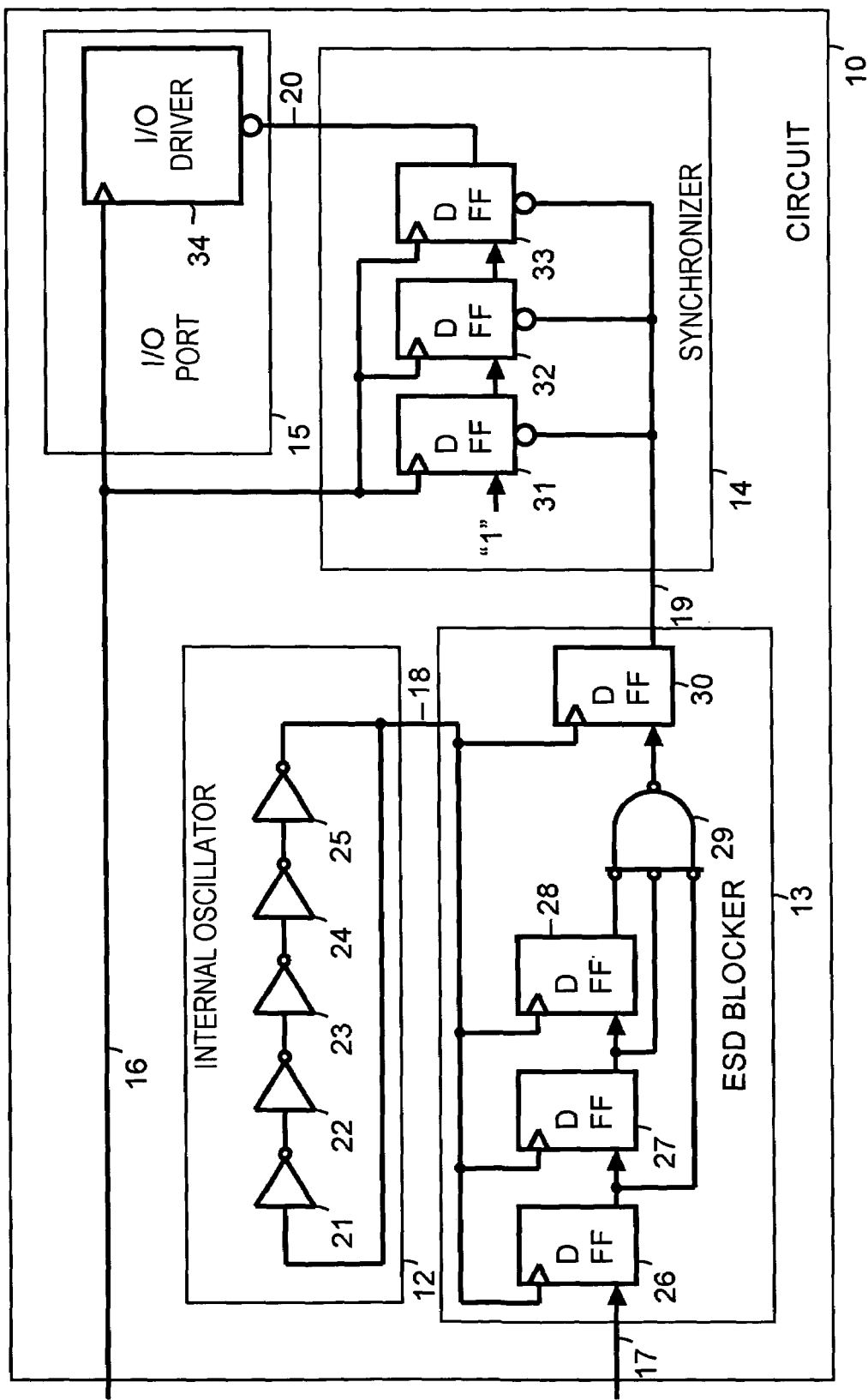
FIG. 2 is a simplified block diagram providing example implementation detail of the power-on reset circuitry shown in FIG. 1 in accordance with an embodiment of the present invention.

FIG. 2 is a simplified block diagram providing example implementation detail of the power-on reset circuitry shown in FIG. 1. Internal oscillator 12 is shown to include a ring oscillator implemented using ring oscillator stages connected in series. The ring oscillator stages are represented by a logic Not gate 21, a logic Not gate 22, a logic Not gate 23, a logic Not gate 24 and a logic Not gate 25. The number of ring oscillator stages required vary based on the processing technology used to manufacture circuit 10, as well as on the frequency range of noise to be filtered. A counter, such as a ripple counter, can be added to achieve lower frequency operation of the internal oscillator. The use of a ring oscillator results in internally generated oscillating signal 18 being emitted very quickly after power is applied to circuit 10.

FIG. 2 shows ESD blocker 13 implemented using a delayed flip-flop (D FF) 26, a D FF 27 and a D FF 28 connected in series, as shown. A logic OR gate 29 receives output from D FF 26, D FF 27 and D FF 28. Since reset signal 17 is asserted low, OR gate 29 effectively performs a logical AND of the asserted-low reset signal on the outputs of D FF 26, D FF 27 and D FF 28. A D FF 30 receives the output of logic OR gate 29 and generates synchronizer reset signal 19. D FF 30 prevents any glitch within the blocker chain of D FF 26, D FF 27 and D FF 28 from propagating to reset signal 19.

The number of stages of flip-flops in ESD blocker 13 can be changed to accommodate the amount of noise immunity desired. There is a small delay for externally generated reset signal 17 to propagate through ESD blocker 13. Typically the propagation delay will be on the order of a few hundred nanoseconds, which should be fast enough to prevent damage to circuit 10 resulting from a drive fight.

The disclosed implementation of ESD blocker 13 is only meant to be exemplary. Other type of circuitry could be used to implement ESD blocker 13 provided internally generated oscillating signal 18 is used to clock the circuitry within ESD blocker 13 when generating synchronizer reset signal 19.

FIG. 2 shows synchronizer 14 implemented using a D FF 31, a D FF 32 and a D FF 33 connected in series, as shown. D FF 31, D FF 32 and D FF 33 are each reset by synchronizer reset signal 19 allowing generation of circuit reset signal 20 without the operation of system clock 16. When synchronizer reset signal 19 is de-asserted, D FF 31, D FF 32 and D FF 33 use system clock 16 to provide synchronization before de-asserting circuit reset signal 20.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. Reset circuitry for an integrated circuit comprising:
   an internal oscillator that produces an oscillating signal upon power-up of the integrated circuit, the internal oscillator not being dependent on signals generated outside the integrated circuit;
   an electro-static discharge blocker circuit, the electro-static discharge blocker circuit receiving an external reset signal generated outside the integrated circuit, the electro-static discharge blocker circuit utilizing the oscillating signal to perform electro-static discharge blocking for the external reset signal to produce an internal reset signal; and
   a synchronizer that synchronizes de-assertion of the internal reset signal, the synchronizer utilizing a system clock generated external to the integrated circuit when performing synchronization.

2. Reset circuit as in claim 1 wherein the internal oscillator is a ring oscillator.

3. Reset circuit as in claim 1 wherein the internal oscillator is a ring oscillator that includes a counter.

4. Reset circuitry as in claim 1 wherein the electro-static discharge blocker comprises:
   a plurality of flip-flops connected in series; and,
   circuitry that performs a logic OR operation on outputs of the plurality of flip-flops.

5. Reset circuitry as in claim 1,
   wherein the internal reset signal is used to reset flip-flops within the synchronizer, allowing the internal reset signal to bypass the synchronizer without requiring the system clock to be functional.

6. Reset circuitry as in claim 1,
   a plurality of flip-flops, the internal reset signal being coupled to a reset input of each of the plurality of flip-flops, thereby allowing the internal reset signal to bypass the synchronizer without requiring the system clock to be functional.

7. Reset circuitry as in claim 6, wherein:
   the internal oscillator comprises a ring oscillator; and,
   the electro-static discharge blocker circuit comprises:
      a second plurality of flip-flops connected in series, and
      a logic OR gate that performs a logic AND operation on outputs of the second plurality of flip-flops.

8. Reset circuitry for an integrated circuit comprising:
   oscillating means for producing an oscillating signal upon power-up of the integrated circuit, the producing of the oscillating signal not being dependent on signals generated outside the integrated circuit;
   blocking means for receiving an external reset signal generated outside the integrated circuit and utilizing the oscillating signal to perform electro-static discharge blocking for the external reset signal to produce an internal reset and
   synchronizing means for synchronizing de-assertion of the internal reset signal utilizing a system clock generated external to the integrated circuit.

9. Reset circuit as in claim 8 wherein the oscillating means comprises a ring oscillator.

10. Reset circuit as in claim 8 wherein the oscillating means comprises a ring oscillator that includes a counter.

11. Reset circuitry as in claim 8 wherein the blocking means comprises:
   a plurality of flip-flops connected in series; and,
   a circuitry that performs a logic OR operation on outputs of the plurality of flip-flops.

12. Reset circuitry as in claim 8, wherein the synchronizing means comprises:
   a plurality of flip-flops, the internal reset signal being coupled to a reset input to each of the plurality of flip-flops, thereby allowing the internal reset signal to propagate through the integrated circuit within the system clock being functional.

13. Reset circuitry as in claim 12, wherein:
   the oscillating means comprises a ring oscillator; and,
   the blocking means comprises:
      a second plurality of flip-flops connected in series, and
      circuitry that performs a logic OR operation on outputs of the second plurality of flip-flops.

14. A method for performing resets within an integrated circuit comprising:
   producing an oscillating signal upon power-up of the integrated circuit, the producing of the oscillating signal not being dependent on signals generated outside the integrated circuit;
   receiving an external reset signal generated outside the integrated circuit and utilizing the oscillating signal to perform electro-static discharge blocking for the external reset signal to produce an internal reset signal; and,
   synchronizing de-assertion of the internal reset signal utilizing a system clock generated external to the integrated circuit.

15. A method as in claim 14 wherein producing an oscillating signal is performed using a ring oscillator.

16. A method as in claim 14 wherein producing an oscillating signal is performed using a ring oscillator that includes a counter.

17. Method as in claim 14, additionally comprising:
   coupling the internal reset signal to a reset input to each of a plurality of flip-flops used in synchronizing de-assertion of the internal reset, thereby allowing the internal reset signal to propagate through the integrated circuit without the system clock being functional.

* * * * *